US011346868B2

(12) United States Patent
Jaton et al.

(10) Patent No.: US 11,346,868 B2
(45) Date of Patent: May 31, 2022

(54) METHOD OF DETERMINING MUTUAL VOLTAGE SENSITIVITY COEFFICIENTS BETWEEN A PLURALITY OF MEASURING NODES OF AN ELECTRIC POWER NETWORK

(71) Applicant: DEPSYS SA, Puidoux (CH)

(72) Inventors: Joël Jaton, Pully (CH); Guillaume Besson, Ropraz (CH); Michael De Vivo, La Tour-de-Peilz (CH); Mauro Carpita, Chamblon (CH); Mario Paolone, La Conversion (CH); Konstantina Christakou, Lausanne (CH); Carl Mugnier, Quintal (FR); Omid Alizadeh-Mousavi, Vevey (CH)

(73) Assignee: DEPSYS SA, Puidoux (CH)

( * ) Notice: Subject to any disclaimer, the term of this patent is extended or adjusted under 35 U.S.C. 154(b) by 425 days.

(21) Appl. No.: 16/095,130

(22) PCT Filed: Apr. 12, 2017

(86) PCT No.: PCT/IB2017/052116
§ 371 (c)(1),
(2) Date: Oct. 19, 2018

(87) PCT Pub. No.: WO2017/182918
PCT Pub. Date: Oct. 26, 2017

(65) Prior Publication Data
US 2020/0003811 A1    Jan. 2, 2020

(30) Foreign Application Priority Data

Apr. 22, 2016 (EP) ..................................... 16166721

(51) Int. Cl.
*G01R 21/00*     (2006.01)
*G01R 15/14*     (2006.01)
(Continued)

(52) U.S. Cl.
CPC ......... *G01R 21/001* (2013.01); *G01R 15/142* (2013.01); *G01R 19/2513* (2013.01);
(Continued)

(58) Field of Classification Search
CPC ..................................................... G01R 21/001
See application file for complete search history.

(56) References Cited

U.S. PATENT DOCUMENTS 5,181,026 A * 1/1993 Granville ............. H02H 1/0069
340/870.28
6,202,041 B1 * 3/2001 Tse ........................... H02J 3/00
703/13
(Continued)

FOREIGN PATENT DOCUMENTS

CN    103 532 520 A     1/2014
CN    104 753 066 A     7/2015
(Continued)

OTHER PUBLICATIONS

Youssef Karim Hassan: "A New Method for Online Sensitivity-Based Distributed Voltage Control and Short Circuit Analysis of Unbalanced Distribution Feeders", IEEE Transactions on Smart Grid, IEEE, USA, vol. 6, No. 3, May 1, 2015 (May 1, 2015), pp. 1253-1260, XP011578872, ISSN: 1949-3053, DOI: 10.1109/TSG.2014.2363158 [retrieved on Apr. 17, 2015] the whole document.
(Continued)

*Primary Examiner* — Hyun D Park
(74) *Attorney, Agent, or Firm* — Nixon & Vanderhye (57) ABSTRACT

The method for determining mutual voltage sensitivity coefficients between a plurality of measuring nodes of an electric power network does not rely on knowledge of the network parameters (for example: series conductance and susceptance of the branches, shunt conductance and susceptance of the nodes, etc.). The method uses a monitoring infrastructure
(Continued)

including metering units at each one of the measuring nodes, and includes a step of measuring at the same time, at each one of the measuring nodes, repeatedly over a time window, sets of data including values of the current, the voltage, and the phase difference, a step of computing active power, reactive power and values from each set of measured data, and a step of performing multiple parametric regression analysis of the variations of the voltage at each one of the measuring nodes.

20 Claims, 5 Drawing Sheets

(51) Int. Cl.
    *G01R 19/25* (2006.01)
    *G01R 21/133* (2006.01)
    *G01R 22/06* (2006.01)
    *G01R 31/08* (2020.01)
    *H02J 3/38* (2006.01)
    *H02J 13/00* (2006.01)
    *G01R 31/50* (2020.01)
    *G01R 31/52* (2020.01)

(52) U.S. Cl.
    CPC ....... *G01R 21/1331* (2013.01); *G01R 22/063* (2013.01); *G01R 31/086* (2013.01); *G01R 31/50* (2020.01); *G01R 31/52* (2020.01); *H02J 3/381* (2013.01); *H02J 13/0006* (2013.01)

(56) References Cited

U.S. PATENT DOCUMENTS

| | | | |
|---|---|---|---|
| 7,687,937 | B2 | 3/2010 | Lasseter et al. |
| 2012/0170320 | A1* | 7/2012 | Lee .......................... H02J 3/381 363/16 |
| 2012/0182157 | A1* | 7/2012 | Carr .......................... H04Q 9/00 340/870.02 |
| 2012/0326503 | A1* | 12/2012 | Birkelund .............. G06Q 50/06 307/24 |
| 2015/0253367 | A1* | 9/2015 | Flammer, III ...... H04L 43/0888 324/76.77 |
| 2015/0357818 | A1 | 12/2015 | Wang et al. |
| 2016/0204609 | A1* | 7/2016 | Tyler ....................... G05B 15/02 700/298 |

FOREIGN PATENT DOCUMENTS

| | | |
|---|---|---|
| EP | 1 909 370 A1 | 4/2008 |
| EP | 2 518 852 A2 | 10/2012 |
| JP | 2005-160260 A | 6/2005 |
| JP | 2005-222444 A | 8/2005 |
| JP | 2010-220283 A | 9/2010 |
| JP | 2012-005310 A | 1/2012 |
| JP | 2013-009556 A | 1/2013 |
| JP | 2014-155430 A | 8/2014 |
| WO | 2014/123189 A1 | 8/2014 |
| WO | 2015/028840 A1 | 3/2015 |
| WO | 2015/193199 A1 | 12/2015 |

OTHER PUBLICATIONS

Konstantina Christakou et al.: "Efficient Computation of Sensitivity Coefficients of Node Voltages and Line Currents in Unbalanced Radial Electrical Distribution Networks", IEEE Transactions on Smart Grid, IEEE, USA, vol. 4, No. 2, Jun. 1, 2013 (Jun. 1, 2013), pp. 741-750, XP011510781, ISSN: 1949-3053, DOI: 10.1109/TSG.2012.2221751 the whole document.

Liu Guodong et al: "A new linearization method of unbalanced electrical distribution networks", 2014 North American Power Symposium (NAPS), IEEE, Sep. 7, 2014 (Sep. 7, 2014), pp. 1-6, XP032689803, DOI: 10.1109/NAPS.2014.6965468 the whole document.

Zhi Li et al: "Application of REI Equivalent in Reactive Power Optimization Control in Regional Power Grid", Power and Energy Engineering Conference (APPEEC), 2011 Asia-Pacific, IEEE, Mar. 25, 2011 (Mar. 25, 2011), pp. 1-4, XP031939357, DOI: 10.1109/APPEEC.2011.5748588 ISBN: 978-1-4244-6253-7 the whole document.

International Search Report, dated Jul. 5, 2017, from corresponding PCT/IB2017/052116 application.

* cited by examiner

METHOD OF DETERMINING MUTUAL VOLTAGE SENSITIVITY COEFFICIENTS BETWEEN A PLURALITY OF MEASURING NODES OF AN ELECTRIC POWER NETWORK

FIELD OF THE INVENTION

The present invention generally concerns the monitoring of electrical distribution networks. More specifically, the invention is directed to a method for determining mutual voltage sensitivity coefficients between several measuring nodes in an electric power network without the knowledge of the network parameters. Once the values of the voltage sensitivity coefficients have been determined, the availability of this data can be made of use for operating the electric power network in a manner that is technically secure and economical. In particular, the availability of the voltage sensitivity coefficients can be made of use for voltage control.

BACKGROUND OF THE INVENTION

The continuously increasing connection of highly intermittent distributed generation in electric power grids, essentially composed of renewable energy resources, leads to violations of operational constraints and calls for the development of dedicated monitoring and control mechanisms. In particular, voltage control is one of the typical controls expected to be deployed in distribution systems.

Schemes for controlling the voltage in grids (or microgrids) have already been proposed. Patent document U.S. Pat. No. 7,687,937 in particular discloses exemplary implementations of what is known as a droop-control method for voltage control. Droop-control methods involve local sensing of the voltage at the connection point between the grid and controllable resources, and the adjustment of the reactive and/or active power injection of the various resources according to a specific voltage droop characteristic. Such methods rely on locally available data and do not take into account grid topology and parameters. This is problematic as droop-control methods tend to lead to suboptimal solutions and, in some cases, to non-feasible operating conditions or even system collapse.

A known alternative approach for controlling the voltage in grids (or microgrids) is described for example in patent document WO2015/193199. This document teaches to apply offline power flow analysis in order to model relationships between, on the one hand, values of voltage, active power and reactive power at each generator in a power distribution network, and on the other hand, remote system conditions of the network. This modeling is done by first calculating sensitivity coefficients on the basis of prior knowledge of both the network's topology (e.g. total number of nodes) and the network parameters (i.e. series conductance and susceptance of the branches, shunt conductance and susceptance of the nodes). In a second step, a nonlinear regression technique is applied to the calculated sensitivity coefficients in order to derive the above-mentioned relationships. The modeled relationships can then be used for controlling the voltage of the distribution networks.

According to this second approach, controlling the voltage of a distribution network involves defining explicit set-points for active and reactive nodal power injections, in such a way as to directly control the grid. These power set points are typically computed as a solution to an online optimization problem in order to guarantee optimal operation of the grid. Such an approach has the advantage of guarantying some level of optimality compared to droop-control methods. However, accuracy of the method depends on having access to an accurate and up-to-date model of the network. Such an up-to-date model is not always available. In particular, in the case of low voltage networks, the networks' topology tends to be adapted quite frequently. Furthermore, feeder parameters, and the status of breakers for instance, can possibly change without this information reaching the distribution network operator (DNO) or distribution system operator (DSO) in due time.

SUMMARY OF THE INVENTION

It is therefore an object of the present invention to alleviate the above-mentioned problems in the prior art by providing a method for the calculation of the voltage sensitivity coefficients of a power distribution network, according to which knowledge of the electrical parameters of the network is not required. The invention achieves this object and others by providing a method for determining mutual voltage sensitivity coefficients between several measuring nodes in an electric power network according to the annexed claim 1.

The expression "downstream" should be understood as meaning further away from the connection to the main grid.

If the amount of power injected or consumed at a particular place in an electric power network changes, it causes the voltages at every location in the network to change as well. However, the change in power affects some nodes in the network more than others. The method of the invention allows for computing a matrix of the mutual voltage sensitivity coefficients between a plurality of measuring nodes in an electric power network, without requiring the knowledge of the network parameters (for example: series conductance and susceptance of the branches, shunt conductance and susceptance of the nodes, etc.). Knowledge of these voltage sensitivity coefficients allows in turn predicting the voltage change, at any particular node, when the amount of power injected or consumed at the same node or at any other particular node changes. This knowledge can then be used, for instance, for determining explicit power set-points or voltage-droop characteristics of controllable resources connected to the network.

Implementation of the invention requires the availability of a basic monitoring infrastructure comprising metering units, a metering unit being arranged at each one of the measuring nodes. The metering units are each arranged for measuring, locally, a voltage, a current and a phase difference between the voltage and the current. The monitoring infrastructure further comprises a communication network, to which the metering units are connected so as to allow for the transmission of data acquired by the metering units to a processing unit. One should note however that, in spite of the need for a monitoring infrastructure, implementation of the invention does not require highly synchronized measurements. This means, in particular, that the metering units do not need to be expensive Phasor Measurement Units (PMUs) having a permanent link to a common time reference, but can be conventional metering devices.

BRIEF DESCRIPTION OF THE DRAWINGS

Other features and advantages of the present invention will appear upon reading the following description, given solely by way of non-limiting example, and made with reference to the annexed drawings, in which.

DETAILED DESCRIPTION OF EXEMPLARY IMPLEMENTATIONS

The subject matter of the present invention is a method for determining mutual voltage sensitivity coefficients between several measuring nodes in an electric power network. As the field, to which the invention applies, is that of electric power networks, an exemplary network will first be described. Actual ways in which the method can operate will be explained afterward.

Figure 1:
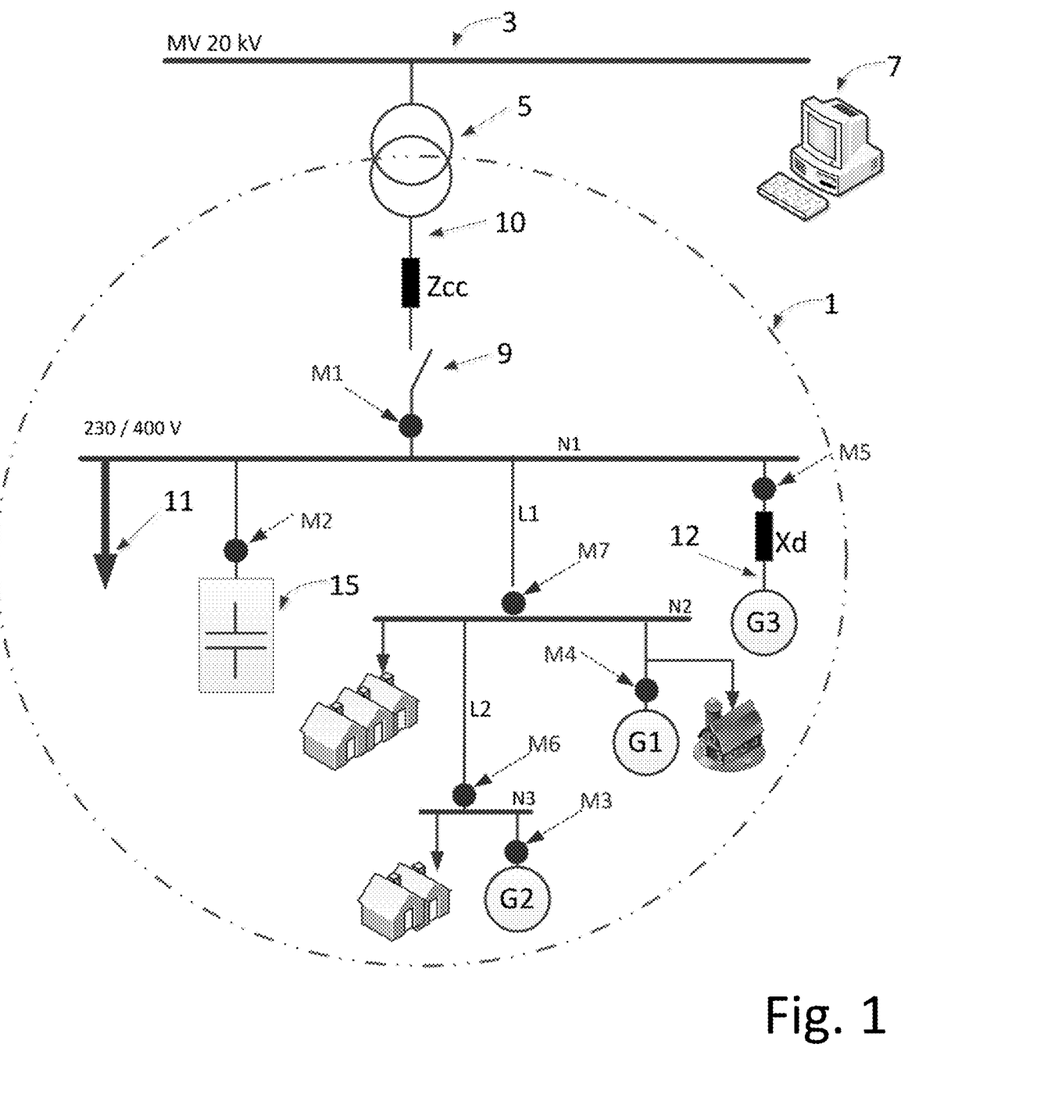
FIG. 1 is a schematic representation of an exemplary power distribution network that is used to explain particular implementations of the method of the invention.

FIG. 1 is schematic representation of an exemplary low-voltage radial distribution network (referenced 1) that is composed of 57 residential blocks, 9 agricultural buildings and supplies in total 88 customers. The low-voltage network 1 (230/400 Volts, 50 Hz) is linked to a medium voltage network 3 by a substation transformer. In FIG. 1, the substation transformer is represented as an ideal transformer (referenced 5) combined with an impedance Zcc that is intercalated between the output of the ideal transformer 5 and the rest of network 1. Table I below is intended to give an idea of possible characteristics for the substation transformer in this particular example:

TABLE I

| Power | Uin | Uout | Coupling | Ucc | X/R |
|---|---|---|---|---|---|
| 250 kVA | 20 kV | 230/400 V | DYn11 | 4.1% | 2.628 |

The substation transformer is connected to network 1 through a circuit breaker 9 and a first bus N1. In the network of the illustrated example, several feeder lines branch out from the bus N1. One of these feeder lines (referenced L1) is arranged to link a subset of five residential blocks and one agricultural building to the low-voltage network. It should be understood that the remaining 52 residential blocks and 8 agricultural buildings can be linked to the bus N1 by other feeder lines that are not explicitly shown in FIG. 1 (but are represented as a whole by a single arrow referenced 11).

The feeder line L1 connects the bus N1 to a second bus (referenced N2). As can be seen in FIG. 1, three residential blocks and one agricultural building are connected to the bus N2. Furthermore, a feeder line L2 connects the bus N2 to a third bus (referenced N3). Two residential blocks are connected to the bus N3. Table II (below) is intended to give an idea of possible characteristics for the feeder lines L1 and L2 used in this particular example:

TABLE II

| Cable type | | Length | R/X [Ohm/km] | C [μF/km] |
|---|---|---|---|---|
| L1 | 1 kV 4 × 240 mm² AL | 219 m | 0.096; 0.072 | 0.77 |
| L2 | 1 kV 4 × 150 mm² AL | 145 m | 0.2633; 0.078 | 0.73 |

Still referring to FIG. 1, it can be seen that the network 1 further comprises three decentralized power plants. A first power plant (referenced G1) is a photovoltaic power plant connected to the bus N2, a second power plant (referenced G2) is a photovoltaic power plant connected to the bus N3, and the third power plant is a diesel powered generator, which is linked to the bus N1. As will be explained in more details further on, the third power plant is arranged to serve as a voltage reference generator when the power network 1 is operating in islanding mode. In FIG. 1, the diesel powered generator is represented as an ideal generator (referenced G3) combined with an impedance Xd that is intercalated between the output of the ideal generator G3 and the rest of network 1. Table IIIA and IIIB (below) are intended to give an idea of possible characteristics for the three decentralized power plants used in this particular example:

TABLE IIIA

| PV Generators | Number of inverters | Voltage [kV] | Rated power [kVA] |
|---|---|---|---|
| G1 | 12 3-phase inverters | 0.4 | 196 |
| G2 | 3 3-phase inverters | 0.4 | 30 |

TABLE IIIB

| Diesel Generator | Voltage [kV] | Synchronous reactance [Ω] | Rated power [kVA] |
|---|---|---|---|
| G3 | 0.4 | 3.2 | 50 |

One can observe that, according to the present example, the photovoltaic power plants G1 and G2 provide a maximum power of 226 kVA. FIG. 1 also shows a battery pack (referenced 15) that is connected to the bus N1 of the network 1. The combined presence of the three decentralized power plants, the battery pack 15 and the circuit breaker 9 offers the possibility of temporarily islanding the low-voltage network 1. Table IV below is intended to give an idea of possible characteristics for the battery pack 15 used in this particular example:

TABLE IV

| Type (technology) | c-rate | Energy [kWh] |
|---|---|---|
| Lithium Titanate | 1.67 | 60 |

Besides an electric power network, the physical environment within which the method of the invention is implemented must also comprise a monitoring infrastructure. According to the invention, the monitoring infrastructure comprises metering units provided at a selection of nodes of the network (in the following text, nodes of the network that are equipped with at least one metering unit are called "measuring nodes"). As previously mentioned, the exemplary low voltage electric power network 1 illustrated in FIG. 1 is a three-phase electric power network. In such a case, a preferred implementation of the invention provides that the voltage and current are measured independently for each one of the three phases, and that the respective phase differences between each voltage and the corresponding current are measured as well. This can be accomplished either by equipping each measuring node in the network with three metering units, or alternatively by using metering units designed for measuring three different phases independently.

FIG. 1 shows the locations of seven different measuring nodes (referenced M1 through M7). However, it should be understood that according to the invention, there could be any number of measuring nodes, possibly as few as two measuring nodes. Furthermore, concerning the particular network illustrated in FIG. 1, it should be understood that the remaining part of the network 1, which is not shown in detail, can possibly comprise additional measuring nodes. The metering units of the nodes M1 through M7 are each arranged for measuring, locally, at least one voltage, one current, as well as a phase difference between the voltage and the current. Referring again to FIG. 1, it can be seen that the first measuring node M1 connects the substation transformer with the bus N1. The second measuring node M2 connects the battery pack 15 with the bus N1, the third measuring node M3 connects the PV system G2 with the bus N3, the fourth measuring node M4 connects the PV system G1 with the bus N2, the fifth measuring node M5 connects the diesel generator with the bus N1, the sixth measuring node M6 connects the feeder L2 with the bus N3. Finally, the seventh measuring node M7 connects the feeder L1 with the bus N2.

According to the invention, the monitoring infrastructure further comprises a communication network, to which the metering units are connected so as to allow for the transmission of data to and from a processing unit 7. In the very schematic illustration of FIG. 1, the processing unit 7 is represented in the form of a computer placed at a distance from the network 1. One will understand however that the processing unit could be located at one of the measuring nodes. Indeed, according to a preferred embodiment of the monitoring infrastructure, the processing unit forms a part of one of the metering units. According to the illustrated example, the communication network is not a dedicated transmission network but the commercial GSM network provided by a mobile operator. One will understand however that according to alternative implementations, the communication network for the monitoring infrastructure could be of any type that a person skilled in the art would consider adequate.

Figure 2:
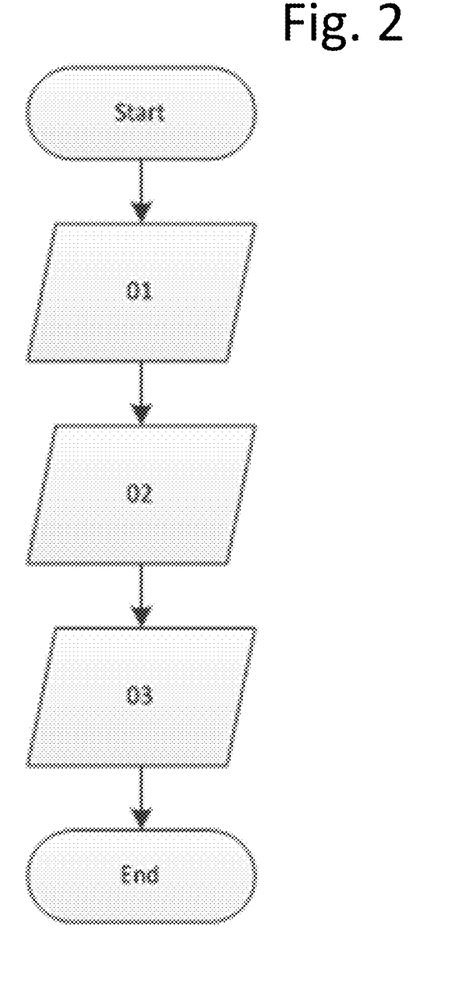
FIG. 2 is a flowchart depicting a first particular implementation of the method of the invention for determining mutual voltage sensitivity coefficients between a plurality of measuring nodes of an electric power network.

FIG. 2 is a flowchart depicting a first exemplary implementation of the method of the invention for determining mutual voltage sensitivity coefficients between a plurality of measuring nodes of an electric power network. The particularly undetailed flowchart of FIG. 2 comprises three boxes. The first box (referenced 01) generally represents a task consisting in determining a succession of values for voltages V, active powers P and reactive powers Q, at a plurality of measuring nodes in an electric power network. Fort this purpose, the method of the invention uses a monitoring infrastructure arranged to measure, repeatedly over a time window τ, the voltage, the current, and the phase difference between the voltage and the current at several locations in the network. According to the invention, the electric power network is an AC power network, and the measured values for the voltage and the current are not instantaneous values, but average values (preferably rms values based on the fundamental frequency of the signal) measured over at least a half period of the AC power, preferably over between two and ten periods of the AC power, and most preferred over three periods of the AC power (i.e. during 60 ms in the case of a 50 Hz AC power network). The method of the invention does not require that measurements at different measuring nodes be highly synchronized. However, it does require that the metering units at different measuring nodes provide measurement values obtained approximately at the same time, or in other words it requires that measurements at different measuring nodes be made at times close enough together to allow subsequently treating the obtained values as being concomitant.

According to the presently described implementation of the invention, the different metering units in the network are synchronized by means of the Network Time Protocol (NTP) via the GSM network that serves as the communication network for the monitoring infrastructure. Advantages of NTP are that it is easy to implement and readily available almost everywhere. A known disadvantage of NTP is that it is not extremely precise. However, contrarily to what might be expected, experience shows that the synchronization provided by NTP is good enough for the method of the invention to produce satisfactory results. It should be understood however that NTP is not the only synchronization method usable with the method of the invention. In particular, according to a considerably costlier implementation, the metering units could be PMUs having a permanent link to a common time reference or a GPS synchronization.

As previously mentioned, the active power and of the reactive power at each measuring node are computed from local values of the measured voltage and current, and from the phase difference between the voltage and the current. This computation can be based on the following relations:

$$P = V \cdot I \cdot \cos \varphi \text{ and } Q = V \cdot I \cdot \sin \varphi$$

According to the presently described first exemplary implementation, computation of the values of the active and reactive powers is implemented locally by each one of the metering units. According to a first variant of the first implementation, a buffer is provided in each metering unit, and the successive time-stamped measurements are saved in a buffer at least until the end of a time window τ during which the voltage, the current and the phase difference between the voltage and the current are measured. Computation of the active and reactive powers is then done on the entire batch of saved measurements once a day for example. As the values obtained by the metering units for the voltage, the current, and the phase difference between the voltage and the current are time-stamped, the subsequently computed values for the active and the reactive powers can "inherit" the timestamps associated with the data from which these values were computed. According to an alternative variant of the first embodiment, computing of the active and the reactive power takes place online in real time, and the obtained values for the voltage and for the active and reactive powers are time-stamped and then saved temporarily in the previously mentioned buffer provided in each metering unit.

It should further be understood that, according to other implementations of the invention, computation of all the values of the active and reactive powers takes place in the processing unit. According to a particular one of these other implementations, the monitoring infrastructure comprises a high speed communication network, and the measurements from all the measuring nodes are transmitted to the processing unit as soon as they are obtained. In this way, the processing unit can compute the values of the active and reactive powers in real time.

According to the invention, measurements of the voltage, the current and the phase difference between the voltage and the current, that take place at different measuring nodes are synchronized to the extent discussed above. According to the present example, the metering units measure the voltage, the current and the phase difference repeatedly, preferably at regular intervals, within a given time window. The number of successive measurements is preferably comprised between 200 and 5000 measurements, preferably between 1000 and 3000 measurements, for instance 2000 measurements. It should be understood however that the optimal number of measurements tends to increase as a function of the number of measuring nodes. On the other hand, the optimal number of measurements tends to decrease with improving accuracy of the measurements provided by the metering units, as well as with improving accuracy of the synchronization between the metering units.

As the values measured by the metering units are not instantaneous values, but average values measured over at least half period of the AC power, the minimal time interval between successive measurements should be equal to several periods of the AC power. Actually, according to the first exemplary implementation, the length for the time intervals separating successive measurements is preferably between 60 ms and 3 seconds, and most favorably between 60 ms and 1 second.

The second box (referenced 02) in the flow chart of FIG. 2 represents the task of computing, for each measuring node, concomitant variations of the measured voltage and of the active and reactive powers, and further of compiling tables of the variations of the voltage at each one of the measuring nodes in relation to concomitant variations of the active and reactive powers at all measuring nodes. Concomitant variations of the measured voltage and of the active and reactive powers can be computed by subtracting from each set of concomitant values of the voltage, the active power and the reactive power respectively, the precedent values of the same variables. In other words, if two consecutive sets of measurements are available at times t and t+Δt:

a variation $\Delta \tilde{V}_i(t)$ is computed for each measuring node as
$\Delta \tilde{V}_i(t) = \tilde{V}_i(t+\Delta t) - \tilde{V}_i(t)$;

a variation $\Delta \tilde{P}_i(t)$ is computed for each measuring node as
$\Delta \tilde{P}_i(t) = \tilde{P}_i(t+\Delta t) - \tilde{P}_i(t)$;

a variation $\Delta \tilde{Q}_i(t)$ is computed for each measuring node as
$\Delta \tilde{Q}_i(t) = \tilde{Q}_i(t+\Delta t) - \tilde{Q}_i(t)$;

where $i \in \{1, \ldots, N\}$, specifies the i-th measuring node. It should further be noted that, in the present description, quantities that correspond to measurements are denoted with tilde (e.g., $\tilde{V}$).

According to the first exemplary implementation of the invention, in order to accomplish the above computation, the processing unit first accesses the communication network and downloads the timestamped values for the voltage $\tilde{V}(t)$, the active power $\tilde{P}(t)$, and the reactive power $\tilde{Q}(t)$ from the buffers of the different metering units. The processing unit then computes variations of the measured voltage and of the active and the reactive powers by subtracting from each downloaded value of the voltage, of the active power and of the reactive power respectively, the value of the same variable carrying the immediately preceding timestamp. One should keep in mind in particular that the times $t \in \{t_1, \ldots, t_m\}$ refer to timestamps provided by different metering units. As, for example, $P_1(t_1)$ and $P_N(t_1)$ were computed from measurements out of different metering units, and that according to the first exemplary implementation their respective clocks were synchronized using NTP, measurements at time t should therefore be understood as meaning measurements at time t±a standard NTP synchronization error.

The processing unit then associates each variation of the voltage at one particular measuring node $\Delta \tilde{V}_i(t)$ with the variations of the active power $\Delta \tilde{P}_j(t)$ and of the reactive power $\Delta \tilde{Q}_j(t)$ at all measuring nodes (where $j \in \{1, \ldots, N\}$, specifies the j-th measuring node) at the same measuring time (where $t \in \{t_1, \ldots, t_m\}$, stands for a particular measuring time or timestamp). As exemplified by table V (next page), the result can be represented as a set of N tables each containing the variations of the voltage at one particular measuring node i in relation to concomitant variations of the active and reactive powers at all measuring nodes 1 to N. The timestamps $\{t_1, \ldots, t_m\}$ correspond to the successive measurement times. These measurement times cover a given time window $\tau = [t_1, t_m]$. According to the invention, m>2N, and preferably m>>N.

TABLE V

| D.V: | Control variables | | | | | |
|---|---|---|---|---|---|---|
| $\Delta V_i(t_1)$ | $\Delta P_1(t_1)$ | ..., | $\Delta P_N(t_1)$ | $\Delta Q_1(t_1)$ | ..., | $\Delta N(t_1)$ |
| $\Delta V_i(t_2)$ | $\Delta P_1(t_2)$ | ..., | $\Delta P_N(t_2)$ | $\Delta Q_1(t_2)$ | ..., | $\Delta N(t_2)$ |
| . | . | | . | . | | . |
| . | . | | . | . | | . |
| . | . | | . | . | | . |
| $\Delta V_i(t_m)$ | $\Delta P_1(t_m)$ | ..., | $\Delta P_N(t_m)$ | $\Delta Q_1(t_m)$ | ..., | $\Delta N(t_m)$ |

The third box (referenced 03) in the flow chart of FIG. 2 represents the task of performing a multiple parametric regression analysis on the N tables of variations previously computed. This analysis takes negative first-order autocorrelation into account. The multiple parametric regression analysis is used to determine the values of a set of voltage sensitivity coefficients that can be grouped in order to form a voltage sensitivity coefficient matrix. According to the implementation of the present example, the regression analysis is of the linear type and the computed voltage sensitivity coefficients are estimations of the linearized dependencies between control variables (power injection) and controlled quantities (voltages). In this particular case, the voltage sensitivity coefficients $K_{Pij}$ and $K_{Qij}$ can be interpreted as estimations of the values of the partial derivatives given below:

$$K_{Pij} \triangleq \frac{\partial V_i}{\partial P_j}; K_{Qij} \triangleq \frac{\partial V_i}{\partial Q_j}$$

To sum up, multiple parametric regression analysis allows predicting the values of the voltage variation $\Delta V_i(t)$, for $t \in \{t_1, \ldots, t_m\}$ and $i \in \{1, \ldots, N\}$, as a function of the concomitant variations of the active power $\{\Delta \tilde{P}_1(t), \ldots, \Delta \tilde{P}_N(t)\}$ and of the reactive power $\{\Delta \tilde{Q}_1(t), \ldots, \Delta \tilde{Q}_N(t)\}$ at all measuring nodes.

Due to the statistical nature of the method, individual measured values tend to deviate to some extent from their predicted value. Accordingly, each measured voltage variation equals the corresponding predicted voltage variation plus/minus an error term. That is:

$\Delta \tilde{V}_i(t) = \Delta V_i(t) + \omega_i(t)$, where $\omega_i(t)$ is the error term.

According to the invention, the multiple parametric regression analysis takes negative first-order autocorrelation into account. This means that the multiple parametric regression analysis assumes that a substantial negative correlation exists between the errors $\omega_i(t)$ and $\omega_i(t+\Delta t)$, where t and t+$\Delta t$ are two consecutive time-steps. In the present description, the expression a "substantial correlation" is intended to mean a correlation, the magnitude of which is at least 0.3, is preferably at least 0.4, and is approximately equal 0.5 in the most favored case.

According to preferred implementations of the invention, the multiple parametric regression analysis further assumes that no substantial correlation exists between the errors from two non-consecutive time-steps. The expression "no substantial correlation" is intended to mean a correlation, the magnitude of which is less than 0.3, preferably less than 0.2, and approximately equal to 0.0 in the most favored case. Accordingly, the correlation between the errors in two non-consecutive time steps is contained in the interval between −0.3 and 0.3, preferably in the interval between −0.2 and 0.2, and it is approximately equal to 0.0 in the most favored case. As the number of successive measurements is m, there are m−1 error terms $\omega_i(t)$ for each measuring node, and therefore (m−1)×(m−1) error correlation terms.

Figure 3:
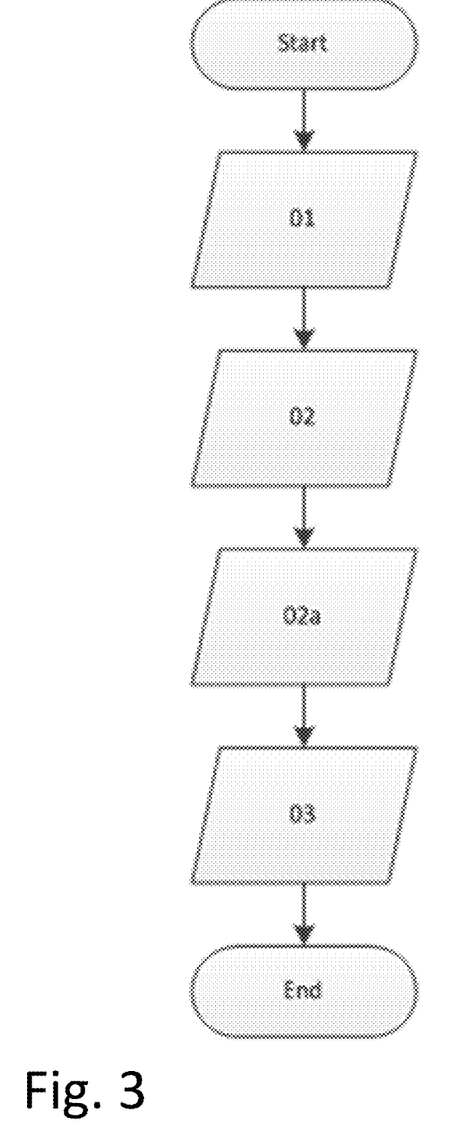
FIG. 3 is a flowchart depicting a second particular implementation of the method of the invention.

FIG. 3 is a flowchart depicting a particular variant of the implementation illustrated by the flowchart of FIG. 2. According to the illustrated variant, the particular type of multiple linear regression that is implemented in box 03 is "generalized least squares". The generalized least squares method allows obtaining the voltage sensitivity coefficients analytically through the resolution of the following equation for each measuring node i∈{1, . . . , N}:

$$K_{PQi} = (\Delta(\tilde{P},\tilde{Q})^T \Sigma_i^{-1} \Delta(\tilde{P},\tilde{Q}))^{-1} \Delta(\tilde{P},\tilde{Q})^T \Sigma_i^{-1} \Delta \tilde{V}_i$$

where $\Sigma_i$ is the correlation matrix of the errors.

The error correlation matrices $\Sigma_i$ are preferably not preloaded into the processing unit, but created only once the tables of voltage vs. power variations have been created (box 02). Indeed, the size of the (m−1) by (m−1) error correlation matrices is determined by the length m−1 of the voltage vs. power variations tables. Accordingly, the variant of FIG. 3 comprise an additional box 02a not present in FIG. 2. Box 02a comprises the task of creating the error correlation matrix for each measuring node. The presence of this additional box after box 02 has the advantage of allowing for adapting the method to the case where the set (or sets) of data associated with one (or more) particular timestamp(s) is/are missing.

In the present example, as is the case with any correlation matrix, the entries in the main diagonal of each one of the N (m−1) by (m−1) correlation matrices are all chosen equal to 1. According to the invention, the entries in both the first diagonal below, and the first diagonal above this, are all comprised between −0.7 and −0.3, and finally all other entries are comprised between −0.3 and 0.3. In the present particular example, the correlation coefficients of the errors between two non-consecutive time-steps are equal to zero, and the correlation coefficients of the errors between two consecutive time-steps are assumed to be −0.5. In this case the error correlation matrices correspond to the tridiagonal matrix shown next page:

$$\Sigma = \begin{pmatrix} 1 & -0.5 & & & \\ -0.5 & \ddots & \ddots & & 0 \\ & \ddots & \ddots & \ddots & \\ & 0 & \ddots & \ddots & -0.5 \\ & & & -0.5 & 1 \end{pmatrix}$$

Figure 4A:
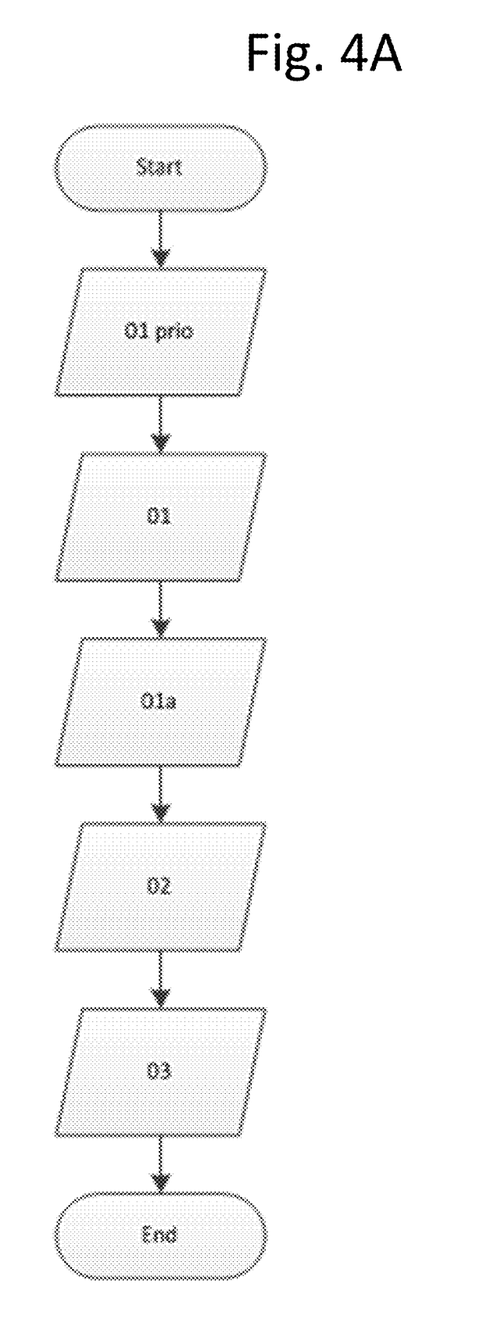
FIG. 4A is a flowchart depicting a third particular implementation of the method.

FIG. 4A is a flowchart depicting another particular variant of the implementation illustrated by the flowchart of FIG. 2. The distinctive feature of the variant of FIG. 4A is that it comprises additional steps making it possible in particular to filter out voltage variations that are caused in the upper-level grid. As previously mentioned, the low-voltage network 1 is linked to a medium voltage network 3 by a substation transformer 5. The transformer is connected to network 1 through a circuit breaker 9 and a first bus N1. The low-voltage network 1 can thus be disconnected from the main portion of the grid by means of the circuit breaker 9.

In the field of electric power networks, the condition in which a portion of the utility grid (in the illustrated example, network 1) becomes temporarily isolated from the main grid but remains energized by its own distributed generation resources (in the illustrated example, G1, G2, G3 and 15) is known as "islanding operation". Islanding may occur accidentally or deliberately. Intentional islanding operation may be desired in cases where the central grid is prone to reliability problems. In this case, the interconnection is designed to permit the particular portion of the grid to continue operating autonomously and provide uninterrupted service to local customers during outages on the main grid. Usually, protective devices must be reconfigured automatically when transitioning between islanded and grid-connected modes.

Referring again to FIG. 1, one can understand that whenever the low-voltage power network 1 operates in the grid-connected mode, any change in voltage supplied to the substation transformer 5 by the medium voltage network 3 has an impact on the voltages at all the measuring nodes in network 1. As long as the voltage supplied by the medium-voltage network 3 is stable, this voltage can be considered as a reference. However, it should be understood that the voltage levels in the medium voltage network can also experience changes. Furthermore, the causes for these changes are, for the most part, completely unrelated to events in the connected low-voltage network.

In the following discussion, the level of the voltage that the substation transformer would output if it was an ideal transformer, having zero impedance, is referred to as the "slack voltage" of the transformer. It should be understood that the slack voltage of the transformer is "pegged" to the voltage supplied to the substation transformer by the medium-voltage network 3, or in other words that, in the case of an ideal transformer, the ratio of the output voltage over the input voltage is constant. Again referring to FIG. 1, one will understand that the slack voltage can be computed straightforwardly. Indeed, the first measuring node M1 connects the substation transformer 5 with the bus N1 of network 1. It follows that the voltage measured by the metering unit of node M1 is the output voltage from the substation transformer. Furthermore, the measured current and phase difference are also those at the output of the transformer. Knowing the impedance (Zcc) of the transformer, it is easy to compute the slack voltage based on the output voltage, the output current and the phase difference between the two.

$V_{slack}(t) = |\overline{V}_1(t) + \overline{Z}_{CC} \cdot \overline{I}_1(t)|$; where variables and factors corresponding to complex numbers are denoted with a bar (e.g., $\overline{Z}_{CC}$).

Comparing the flowchart of FIG. 4A with the flowchart of FIG. 2, it can be seen that it comprises two additional boxes referred to as box "$01^{PRIOR}$" and box "01a". As previously mentioned, the method steps represented by these boxes are intended for filtering out voltage variations that originate from the upper-level grid. Box "$01^{PRIOR}$" represents the task accomplished by the monitoring infrastructure or system of loading method parameters. According to the presently described implementation, the method parameters comprise a measurement schedule, information as to which metering unit is located at the output of the transformer, as well as to the value of the impedance Zcc of the transformer. Box "01a", represents the task of computing the slack voltage. This task is accomplished either by the processing unit, or directly by the metering unit located at the output of the transformer (node M1 in FIG. 1). The slack-voltage is computed repeatedly, preferably each time the metering unit of the first node M1 measures the voltage, the current and the phase difference. As the sets of data obtained by the first metering unit from each successive measurement are time-stamped, the different computed values for the slack voltage can "inherit" the timestamps associated with the respective sets of data from which the values were computed. The timestamped values of the slack-voltage are subsequently subtracted from the voltages measured at the same time at every measuring node. This subsequent computation can be done either by the processing unit, or by the metering units at each measuring node.

Figure 4B:
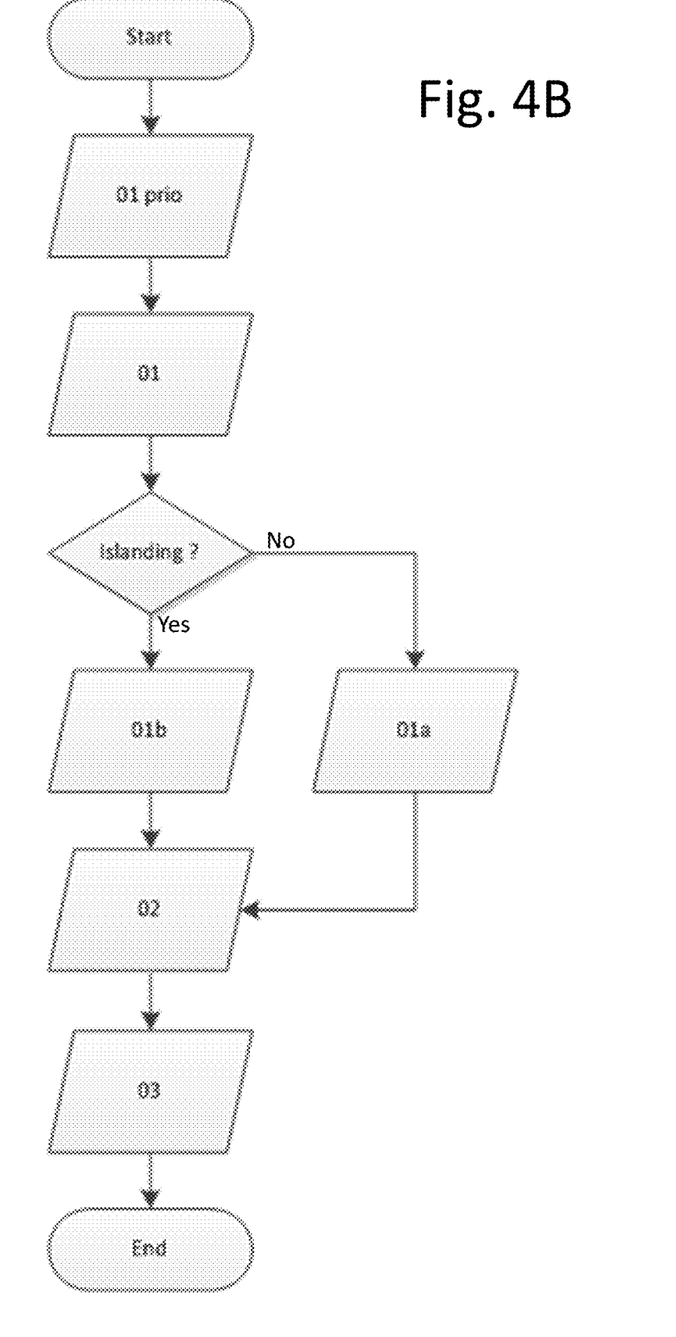
FIG. 4B is a flowchart depicting a fourth particular implementation of the method of the invention.

FIG. 4B is a flowchart depicting a preferred form of the implementation shown in FIG. 4A. The particular way of implementing the method of the invention that is shown in FIG. 4B is designed for use with an electric power network capable of transitioning between an islanded and a grid-connected mode of operation. Referring again to the electric power network of FIG. 1, one can observe that, according to the illustrated example, it is the status of the circuit breaker 9 that determines in which mode the network 1 is presently operating. In a similar fashion to what was described in relation to FIG. 4A, the monitoring infrastructure loads a number of method parameters during a step represented by box "$01^{PRIOR}$". As previously described, the method parameters comprise a measurement schedule, information as to which metering unit is located at the output of the transformer, as well as to the value of the impedance of the transformer. Furthermore, according to the implementation of FIG. 4B, the method parameters also comprise the "open" or "closed" status of the circuit breaker 9 and the value of the impedance Xd of the diesel powered generator. According to the illustrated example, the task, represented by box "01a", comprising the actions of computing and of subtracting the slack voltage of the transformer, is implemented whenever the electric power network is operating in a grid-connected mode. In the opposite situation, when the grid is operating in islanding mode, the method of the present example does not implement the task of box "01a", but implements an alternative task (box "01b") instead. The task represented by box "01b" comprises computing and subtracting the slack voltage of the generator from the voltages measured at the same time at every measuring node. As previously explained, the monitoring infrastructure has access to the status of the circuit breaker 9. In the present example, the "open" or "closed" status is loaded into the system with the other method parameters. It should be understood however that the current status of the circuit breaker could alternatively be readable online at any time.

Figure 4C:
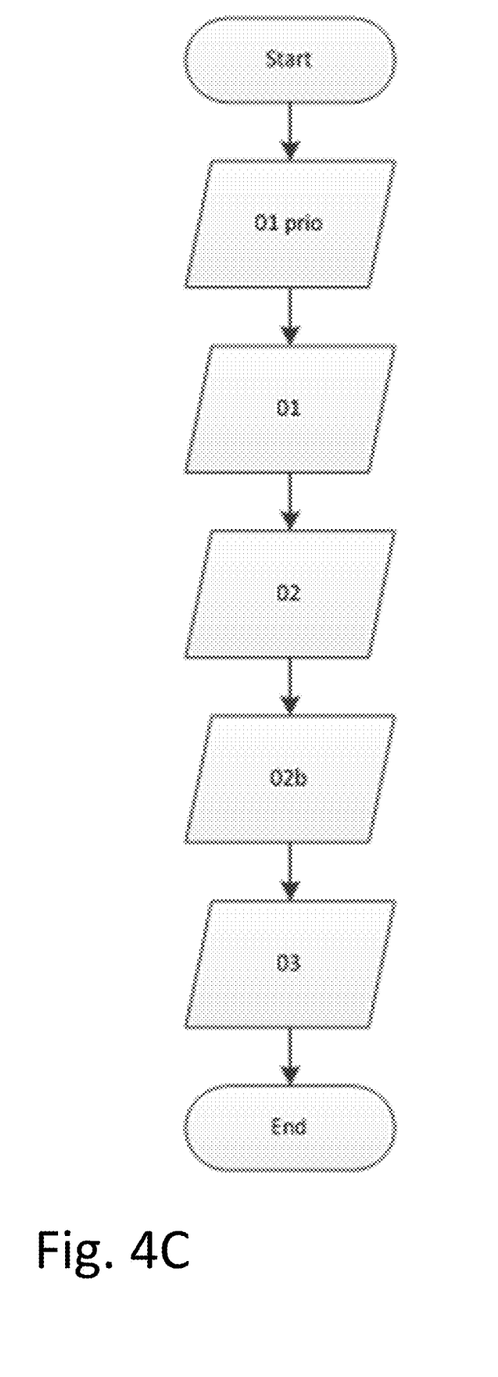
FIG. 4C is a flowchart depicting a fifth particular implementation of the method of the invention.

FIG. 4C is a flowchart depicting another particular variant of the implementation illustrated by the flowchart of FIG. 2. This particular variant has a lot in common with the variant depicted in FIG. 4A. In particular, it also comprises steps making it possible to filter out the component of the voltage variations that is caused by variations of the slack voltage. Comparing the flowchart of FIG. 4C with the flowchart of FIG. 4A, it can be seen on the one hand that FIG. 4C comprises an additional box "02b", and that on the other hand the box "01a" of FIG. 4A is absent in FIG. 4C.

In a similar manner to what was previously described in relation to FIG. 4A, box "02b" represents the task of computing the slack voltage. This task can be accomplished either by the processing unit or directly by the metering unit located at the output of the transformer (node M1 in FIG. 1). The successive computed values of the slack voltage are then used in order to compute variations of the slack voltage. The variations of the slack voltage are computed simply by subtracting from each value of the slack voltage, the precedent value of the same variable. The computed variations of the slack voltage are subsequently subtracted from the variations of the voltage measured at the same time at every measuring node. This subsequent computation can be done either by the processing unit or by the metering units at each measuring node.

Figure 5:
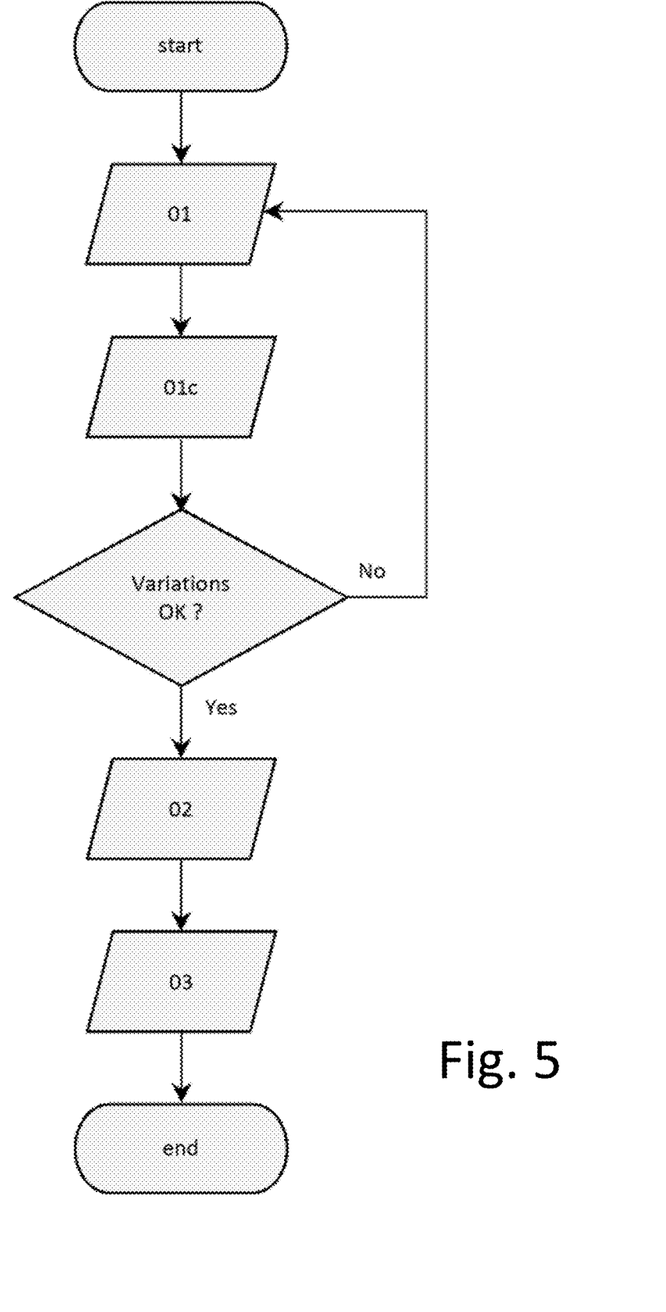
FIG. 5 is a flowchart depicting a sixth particular implementation of the method of the invention.

FIG. 5 is a flowchart depicting another particular variant of the implementation illustrated by the flowchart of FIG. 2. The distinctive feature of the variant of FIG. 5 is that it comprises two additional steps for testing the quality of the acquired data prior to the step of statistically estimating the sensitivity coefficient matrix.

According to the illustrated example, a set of measurements is considered suitable for the statistical estimation of the voltage sensitivity coefficients if the amount of variation of the active power $\tilde{P}_i(t)$ and of the reactive power $\tilde{Q}_i(t)$ at each measuring node i (for i∈{1, . . . , N}) is large enough. This condition ensures that the voltage sensitivity coefficients can be properly estimated using the measurements. According to the described implementation, the amounts of variation of the active and of the reactive power are assessed by computing the standard deviations of the timestamped active power values $\tilde{P}_i(t)$ and reactive power values $\tilde{Q}_i(t)$ for timestamps t∈{$t_1$, . . . , $t_m$} originating from a predefined time window. For instance, the measurements can be considered suitable if the standard deviations of $\tilde{P}i(t)$ and $\tilde{Q}i(t)$ are larger than a predefined threshold value. The predefined threshold value can be selected, for example, to be equal to 10% of the absolute value of the corresponding mean, and preferably to be equal to 20% of the absolute value of the corresponding mean.

Comparing the flowchart of FIG. 5 with the flowchart of FIG. 2, it can be seen that it comprises a first additional box referred to as box "01c". Box "01c" represents the task of computing the standard deviation of the active and reactive powers for each measurement node. The step of statistically estimating the sensitivity coefficient matrix (box "03") is then carried out if the measurements at all the measuring nodes are identified as suitable. In the case where the measurements are not suitable for the estimation, a replacement set of data is acquired during a new time window.

Although the method of the invention has been illustrated and described in greater detail by means of exemplary implementations, the invention is not restricted by the disclosed examples and various alterations and/or improvements could be derived therefrom by a person skilled in the art without departing from the scope of the present invention defined by the annexed claims.

The invention claimed is:

1. A method for determining mutual voltage sensitivity coefficients between a plurality of measuring nodes (M1, . . . , M7) of an electric power network and for using said voltage sensitivity coefficients for determining explicit power set-points or voltage-droop characteristics of controllable resources connected to the electric power network in such a way as to directly control the network, the electric power network being provided with a monitoring infrastructure comprising metering units at each one of said measuring nodes, for measuring a voltage, a current and a phase difference between the voltage and the current, locally, the monitoring infrastructure comprising a processing unit connected to a communication network, the metering units being connected to the communication network so as to allow for data transmission to and from the processing unit; the method comprising the steps of:

I. measure concomitantly, at each one of said measuring nodes (M1, ..., M7), repeatedly over a time window ($\tau$), sets of data comprising values of the current ($\tilde{I}(t)$), the voltage ($\tilde{V}(t)$), and the phase difference ($\varphi(t)$), timestamp ($t \in \{t_1, ..., t_m\}$) the sets of measured data, and compute a timestamped active power value ($\tilde{P}(t)$) and a timestamped reactive power value ($\tilde{Q}(t)$) from each set of measured data;

II. for each one of said measuring nodes, compute concomitant variations ($\Delta\tilde{V}_i(t), \Delta\tilde{P}_i(t)\Delta\tilde{Q}_i(t)$) of the voltage measured in step I (box "01") and of the active and reactive power values computed in step I (box "01"), by subtracting from each set of concomitant values of the voltage, the active power and the reactive power respectively, respective precedent values of said voltage measured in step I (box "01"), and compile chronologically ordered tables of the variations of the voltage ($\Delta\tilde{V}_i(t)$) at each one of the measuring nodes (M1, ..., M7) in relation to concomitant variations of the active ($\Delta\tilde{P}_1(t), ..., \Delta\tilde{P}_N(t)$) and reactive powers ($\Delta\tilde{Q}_1(t), ..., \Delta\tilde{Q}_N(t)$) at all measuring nodes (M1, ..., M7);

III. perform multiple parametric regression analysis of the variations of the voltage at each one of the measuring nodes as compiled during step II (box "02"), while taking into account negative first-order serial correlation between error terms corresponding to discrepancies between actual voltage variations ($\Delta\tilde{V}_i(t)$) and the variations predicted by the regression analysis, and obtain from computed values of the parameters in the regression analysis, a matrix of mutual voltage sensitivity coefficients between the measuring nodes of the electric power network; and IV. use at least one of the voltage sensitivity coefficients in the matrix to make a prediction of a voltage change at any particular measuring node when the amount of power injected or consumed at the same or at another node changes, directly controlling the network by using the prediction of a voltage change to determine explicit power set-points for controllable resources connected to the network, or by determining voltage droop characteristics of the controllable resources connected to the network, and then adjusting the reactive and/or active power injection of the controllable resources according to the determined voltage droop characteristics.

2. The method for determining mutual voltage sensitivity coefficients according to claim 1, wherein the multiple parametric regression analysis of step III (box "03") is performed while assuming that the correlations between two error terms corresponding to consecutive time-steps are contained in the interval between −0.7 and −0.3, and that the correlations between two error terms corresponding to nonconsecutive time-steps are contained in the interval between −0.3 and 0.3.

3. The method for determining mutual voltage sensitivity coefficients according to claim 1, wherein a preexisting commercial network provided by a mobile operator serves as the communication network.

4. The method for determining mutual voltage sensitivity coefficients according to claim 1, wherein the metering units are synchronized by means of the Network Time Protocol (NTP) via the communication network.

5. The method for determining mutual voltage sensitivity coefficients according to claim 1, wherein the electric power network is arranged to be supplied with electric current from another network, through a first one of said measuring nodes (M1), by a voltage converter having an impendence (Zcc), a value of which is known, the method comprising an additional step (box "01a") between step I (box "01") and step II (box "02"), wherein on the basis of the value of the impendence, successive slack voltage values are computed from values of the successive local measurements, at the first measuring node (M1), of the voltage ($\tilde{V}_1(t)$), the current ($\tilde{I}_1(t)$) and the phase difference ($\varphi_1(t)$) between the voltage and the current, and each value of the computed slack voltage is subtracted from the corresponding voltage values measured at the same time at each one of said plurality of measuring nodes (M1, ..., M7).

6. The method for determining mutual voltage sensitivity coefficients according to claim 5, the method comprising prior to step I (box "01"), an additional step (box "01$^{prior}$") wherein method parameters are loaded into the processing unit, the method parameters comprising information as to which node is located at the output of the voltage converter, as well as to the value of the impedance (Zcc) of the voltage converter.

7. The method for determining mutual voltage sensitivity coefficients according to claim 6, wherein the method parameters loaded into the processing unit comprise an indication of whether or not the electric power network is grid-connected.

8. The method for determining mutual voltage sensitivity coefficients according to claim 5, wherein the action of subtracting the computed slack voltage (box "01a") is implemented by the processing unit.

9. The method for determining mutual voltage sensitivity coefficients according to claim 1, wherein said metering units each comprise a controller and a buffer, and step I (box "01") is integrally implemented in a decentralized manner by the metering units.

10. The method for determining mutual voltage sensitivity coefficients according to claim 9, the method comprising, after step I (box "01") an additional step Ic (boxes "01c" and "Variations OK ?") of assessing whether the amount of variation over a time window of the active power ($\tilde{P}_i(t)$) and of the reactive power ($\tilde{Q}_i(t)$) at each measuring node i (for $i \in \{1, ..., N\}$) is larger than a predefined threshold value, and wherein the method returns to step I in order to acquire a replacement set of data during a new time window in the event that said variations are not larger than the predefined threshold value.

11. The method for determining mutual voltage sensitivity coefficients according to claim 10, wherein assessment during step Ic of the amount of variation over a time window of the active power $\tilde{P}_i(t)$ and of the reactive power $\tilde{Q}_i(t)$ at each measuring node i (for $i \in \{1, ..., N\}$) (box "01c") is implemented in a decentralized manner by the metering units.

12. The method for determining mutual voltage sensitivity coefficients according to claim 10, wherein step Ic (boxes "01c" and "Variations OK ?") is implemented by the processing unit.

13. The method for determining mutual voltage sensitivity coefficients according to claim 11, wherein, after step I (box "01") has been completed, the processing unit accesses the communication network and downloads the time-stamped values for the voltage ($\tilde{V}_i(t)$), the active power ($\tilde{P}_i(t)$), and the reactive power ($\tilde{Q}_i(t)$) from the metering units.

14. The method for determining mutual voltage sensitivity coefficients according to claim 1, wherein the metering units each comprise a controller and working memory, and wherein one of the metering units serves as the processing unit.

15. The method for determining mutual voltage sensitivity coefficients according to claim 1, wherein the network is a three-phase electric power network, and wherein the voltage and current are measured independently for each one of the three phases, as are also the respective phase differences between each measured voltage and the corresponding current.

16. The method for determining mutual voltage sensitivity coefficients according to claim 1, wherein the measured values for the voltage ($\tilde{V}_i(t)$) and the current ($\tilde{I}(t)$) are average values measured over at least a half period of the AC power.

17. The method for determining mutual voltage sensitivity coefficients according to claim 16, wherein the average values are root mean square values (rms), and wherein the average values are measured over at least two periods, but no more than ten periods of the AC power.

18. The method for determining mutual voltage sensitivity coefficients according to claim 16, wherein the average values are root mean square values (rms), and wherein the average values are measured over three periods of the AC power.

19. The method for determining mutual voltage sensitivity coefficients according to claim 1, wherein, in step I (box "01"), the sets of data measured repeatedly are measured at regular intervals.

20. The method of claim 1, wherein the multiple parametric regression analysis of step III (box "03") is performed while assuming that the correlations between two error terms corresponding to consecutive time-steps are about equal to −0.5, and that the correlations between two error terms corresponding to non-consecutive time-steps are about 0.0.

* * * * *